United States Patent [19]

Pant

[11] Patent Number: 5,500,590
[45] Date of Patent: Mar. 19, 1996

[54] APPARATUS FOR SENSING MAGNETIC FIELDS USING A COUPLED FILM MAGNETORESISTIVE TRANSDUCER

[75] Inventor: Bharat B. Pant, Minneapolis, Minn.

[73] Assignee: Honeywell Inc., Minneapolis, Minn.

[21] Appl. No.: 277,856

[22] Filed: Jul. 20, 1994

[51] Int. Cl.$^6$ ............................ G01R 33/09; H01L 43/08
[52] U.S. Cl. .................... 324/252; 324/207.21; 324/249; 327/510; 338/32 R
[58] Field of Search ............................ 324/207.21, 235, 324/249, 252, 117 R; 338/32 R; 327/510; 360/113; 257/421–427

[56] References Cited

U.S. PATENT DOCUMENTS

| | | | |
|---|---|---|---|
| 4,533,872 | 8/1985 | Boord et al. | 324/252 |
| 5,247,278 | 9/1993 | Pant et al. | 338/32 R |

FOREIGN PATENT DOCUMENTS 030041  6/1981  European Pat. Off. .

OTHER PUBLICATIONS

C. H. Bajorek, et al, "A Permally Current Sensors", IEEE Transactions on Magnetics, vol. MAG–12, No. 6, Nov. 1976, pp. 813–815.
"Self Biased Magnetoresistive Bridge Configuration for Current Measurement", IBM Technical Dislosure Bulletin, vol. 18, No. 11, Apr. 1976, pp. 3847–3851.
Phillips Technical Publication 268, Phillips Components, May 1990.
"Magnetoresistive Sensors", Bharat B. Pant, Scientific Honeyweller, Fall 1987 pp. 29–34.

Primary Examiner—Gerard R. Strecker
Attorney, Agent, or Firm—Gregory A. Bruns

[57] ABSTRACT

A first magnetically coupled film sensing element and a second magnetically coupled film sensing element are arranged to change resistance in response to a magnetic filed when biased by a current through the elements. A current carrying conductor spaced from the elements sets the magnetization in the elements. A transfer function of the elements is adjusted by varying the current through the elements or the current through the conductor.

10 Claims, 7 Drawing Sheets

APPARATUS FOR SENSING MAGNETIC FIELDS USING A COUPLED FILM MAGNETORESISTIVE TRANSDUCER

BACKGROUND

Figure 1:
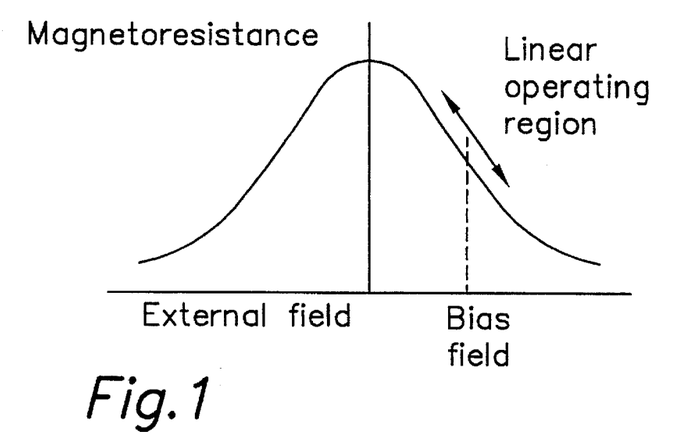
FIG. 1 is a curve of magnetoresistance versus external magnetic field.

The present invention relates generally to magnetic field sensors and specifically to a configuration for a coupled film magnetic transducer. It is well known that a long, thin strip of magnetoresistive film, e.g., NiFe, can be set in a single domain state such that the magnetization is parallel to the long dimension of the strip. Once the strip has been set in a single domain state, the resistance of the strip versus an external magnetic field can be represented by a bell shaped curve as shown in FIG. 1. To obtain a linear output, the strip is typically subjected to an external bias field that places its resistance in the middle of one of the linear portions of the bell shaped curve. It has been shown that adjacent thin films magnetoresistive material separated by an interlayer material undergo magnetostatic coupling.

In certain magnetic field sensing applications, the space available for sensing devices is extremely limited and there is a need for miniaturized magnetic field sensors. Further in certain applications there is a need to be able to adjust or vary the response characteristics of the sensing device while it is in use. An example is the use of magnetic field sensing devices within a known magnetic field to establish the location of another device to which the sensor device is attached. A coupled film magnetic field sensor inherently offers certain advantages relative to miniaturization.

Thus a need exists for a coupled film miniaturized magnetic sensor in which the response characteristics may be varied while in use.

SUMMARY OF THE INVENTION

The present invention solves this and other needs by providing first and second coupled film magnetic field sensing elements arranged to change resistance in response to a magnetic field when biased by a current through the elements. A current carrying conductor sets the magnetization in said elements. The elements are typically connected in a bridge arrangement which provides transfer function. The transfer function is adjusted by varying the current through the elements or by providing a small aiding current in the current carrying conductor.

DESCRIPTION OF THE DRAWINGS

FIG. 2b is a plan view of the coupled film strips of FIG. 2a.

FIG. 3c is a sectional view of a portion of FIG. 3a.

DETAILED DESCRIPTION

Figure 2A:
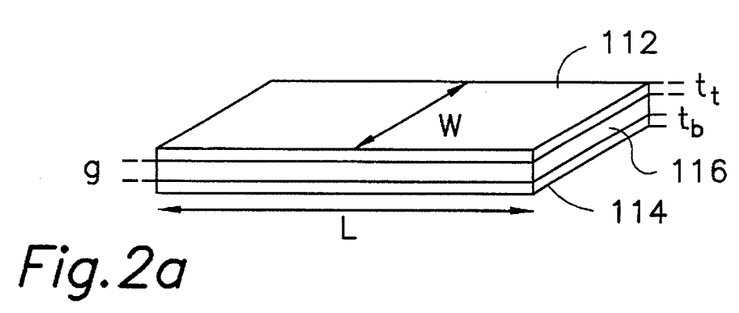
FIG. 2a is a perspective view of coupled film strips.

FIG. 2a shows strips 112 and 114 of thin magnetoresistive films of common width W, thicknesses $t_t$ and $t_b$ separated by an interlayer 116 of non magnetic material of thickness g. The interlayer can be either a conducting or an insulating material. Strips 112 and 114 are connected at the ends with a source of current (not shown). If interlayer 116 is insulating, the current passes through only one layer (assumed to be the top layer in this example). If interlayer 116 is conducting, the current passes through both the layers. The present invention functions with either type of interlayer.

Figure 2B:
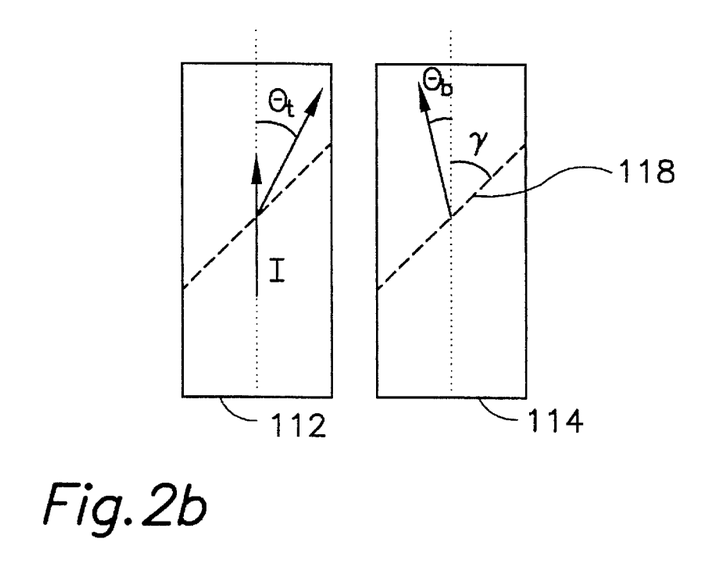

In FIG. 2b, the top view of the two strips is shown. The material easy axis 118 forms an angle γ with respect to the long dimension. The two strips are magnetostatically coupled—a rotation of magnetization in one of the strips results in the rotation of magnetization in the opposite direction in the other strip. Under the influence of a current flowing through one or both layers, the direction of magnetization of the top and bottom layers form angles θt and θb with respect to the long dimension. Since the films are magnetoresistive, the resistance of the strips changes as a function of supply current. An external field parallel to the long dimension causes the magnetization in both layers to rotate either toward the long dimension or perpendicular to it, depending on whether the field is parallel or not parallel to the magnetization, causing a change in the resistance. This effect is used to design magnetic transducers of coupled layers of magnetic films.

An apparatus for sensing magnetic fields is shown in the drawings and generally designated 10. A first embodiment of an apparatus 10 is shown in diagrammatic form in FIG. 3a which shows coupled film magnetic field sensing elements 120 and 122 which are made, for example, using a group of strips 124 of 200 angstrom thick NiFe films separated by an interlayer of 100 angstroms thick Tantalum Nitride of 5 microns width and conducting length of 70 microns. This gives a single strip resistance of approximately 90 ohms. Sixteen of strips 124 connected in series by interconnects 126 gives a resistance of 1440 ohms for each of elements 120 and 122. Bonding pads 128, 130 and 132 are shown for making electrical connections to elements 120 and 122. Conductor or current strap 134 is approximately 160 microns wide and is U-shaped. Bonding pads 136 and 138 are shown for making connections to conductor 134. The coupled film magnetoresistive elements, the current strap and all bonding pads may be efficiently formed on a single chip 140 as illustrated in FIG. 3a.

Figure 3A:
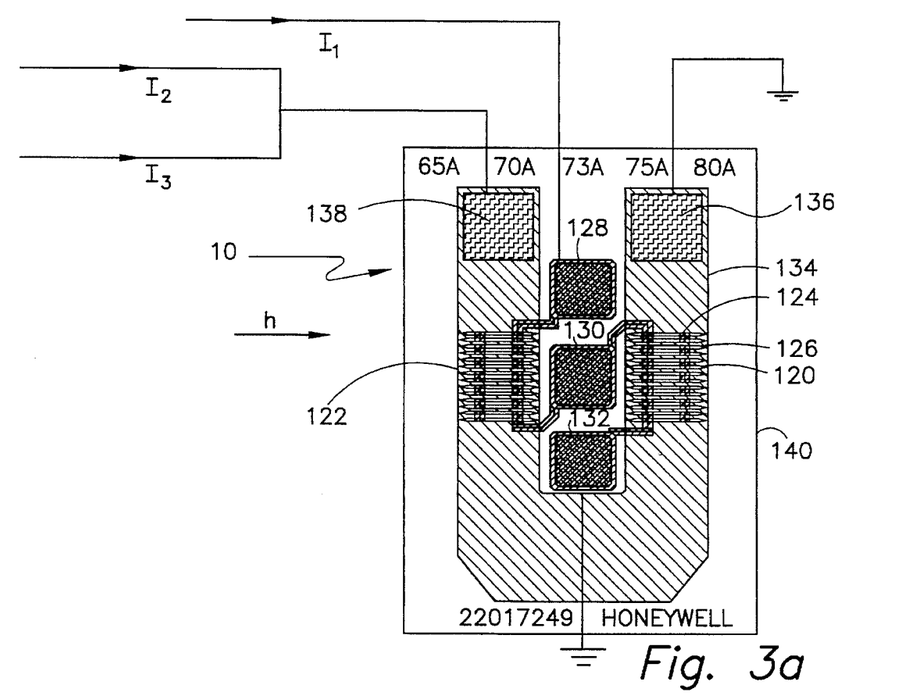
FIG. 3a is a plan view of a coupled film magnetoresistive transducer in accordance with the present invention.
Figure 3B:
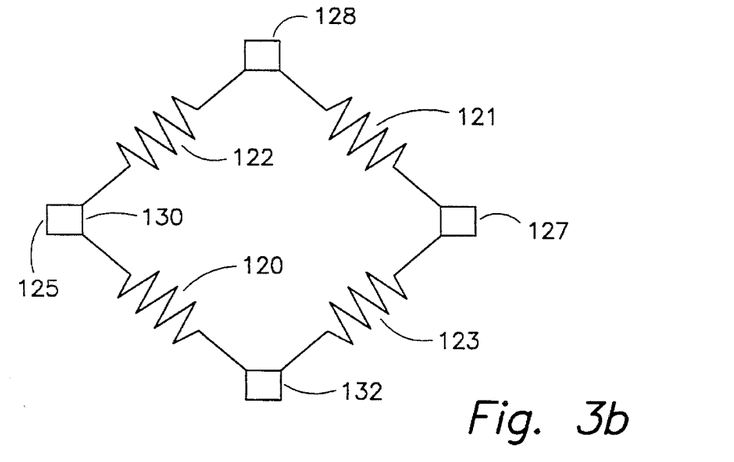
FIG. 3b is a schematic of the transducer of FIG. 3a when connected in a bridge arrangement.
Figure 3C:
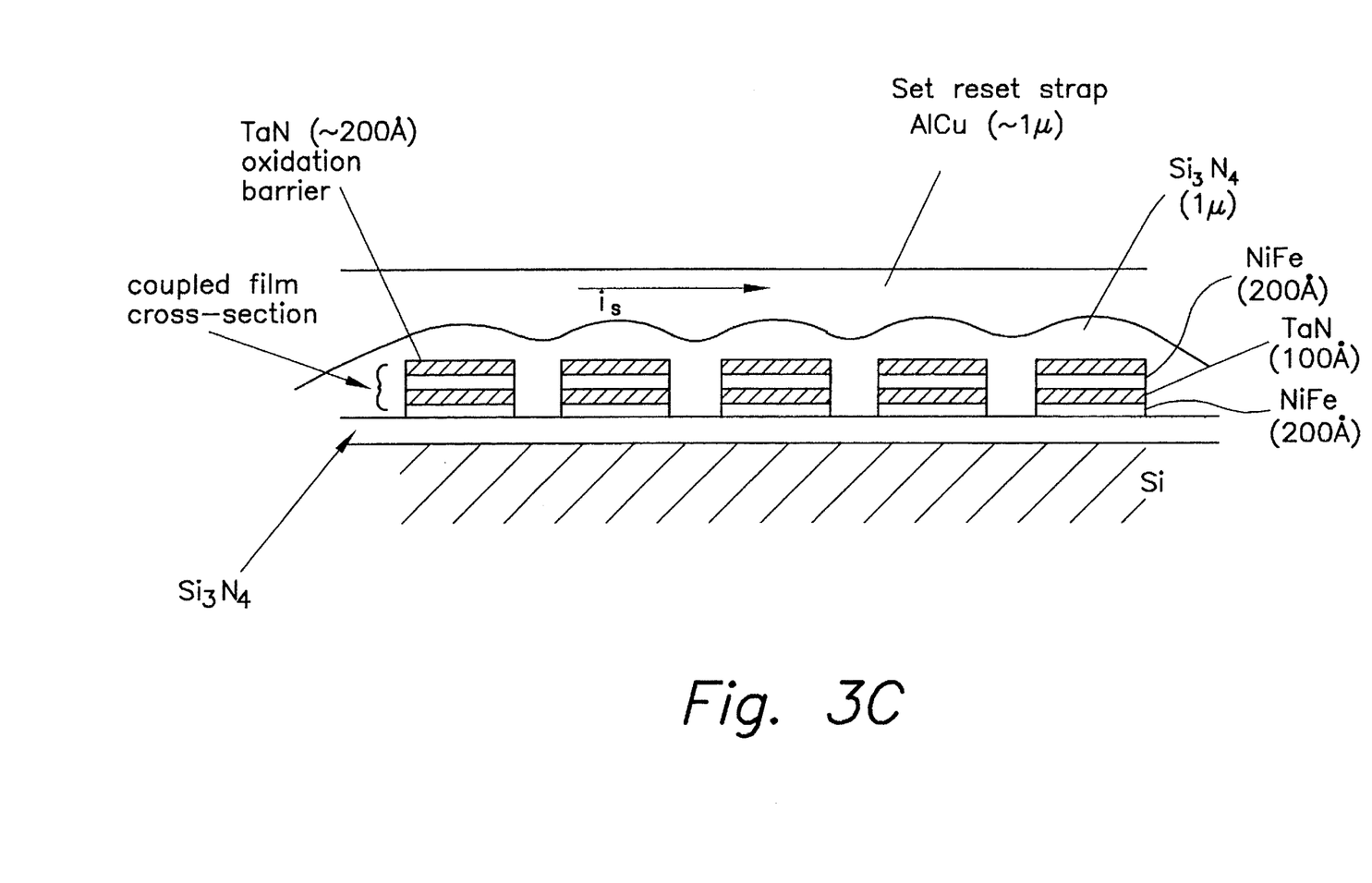

A sectional view of the coupled film module of FIG. 3a taken perpendicular to magnetoresistive strips 124 is shown in FIG. 3c where representative thickness values are also shown. Starting with a silicon substrate, a layer of silicon nitride of, for example, 3000–5000 Angstroms thick is provided. Coupled films are shown as nickel-iron of approximately 200 Angstroms, Tantalum of approximately 100 Angstroms and nickel-iron of approximately 200 Angstroms. An additional layer of Tantalum of approximately 200 Angstroms can be provided on top of the coupled film strips as an oxidation barrier.

Next, a layer of silicon nitride (SI3n4) overlays the coupled film cross-sections and may have a thickness of approximately 1 micron. The next layer is a set-reset strap which may be of aluminum copper and may be of approximately 1 micron thickness.

In operation a current I1 passing through elements 120 and 122 may be used to establish a magnetic bias so that a linear relationship will exist between the resistance changes of elements 120 and 122 when subjected to a magnetic field h parallel to strips 124. One function of conductor 134 is to set magnetic domains in elements 120 and 122 by passing a current through conductor 134. This is referred to as the set-reset function. For example, a current of approximately 1 amp for a duration of approximately 1 millisecond has been found adequate for setting magnetic domains. A current I2 passing through conductor 134 may be used to set magnetic domains in elements 120 and 122 in opposite directions. When elements 120 and 122 are connected as shown in FIG. 3b with non-magnetoresistive resistors 121 and 123 as explained hereinafter, and subjected to an external magnetic field h, elements 120 and 122 will change resistance and a signal across 130 and 127 will be representative of the magnetic field. The relationship of the signal across 130 and 127 to the external magnetic field is referred to as the transfer function. In addition a current I3 may be passed through conductor 134 and will have the effect of modifying the transfer function. Current I3 will be referred to as an aiding current. The aiding current is aiding the magnetization to keep it more stable. The aiding current is applying a field in the direction of magnetization as it was originally set in the magnetoresistive strip. The aiding current is helping the original direction of magnetization to remain fixed. The aiding current is applied during the time a measurement is being made. A set-reset current pulse may be applied simultaneously with the aiding current, or may be applied non-simultaneously.

An advantage of this design is the ability to tailor the sensitivity of the transducer. Since the sensitivity is a function of supply voltage, it can be changed to fit the needs of the application by changing the supply current. Certain applications demand an increased range of linearity. This can be achieved by sending a small current through the set-reset strap continuously during the operation of the transducer. The direction of such a current must be in the same direction as the original setting pulse. Of course, such an increase in the range of linearity results in a corresponding decrease of sensitivity. The same mechanism also serves to extend the range of the disturb field, i.e., external field at which the transducer will change from a single domain state to a multi-domain state. The sensor must be operated in a single domain state for sensing.

Figure 4A:
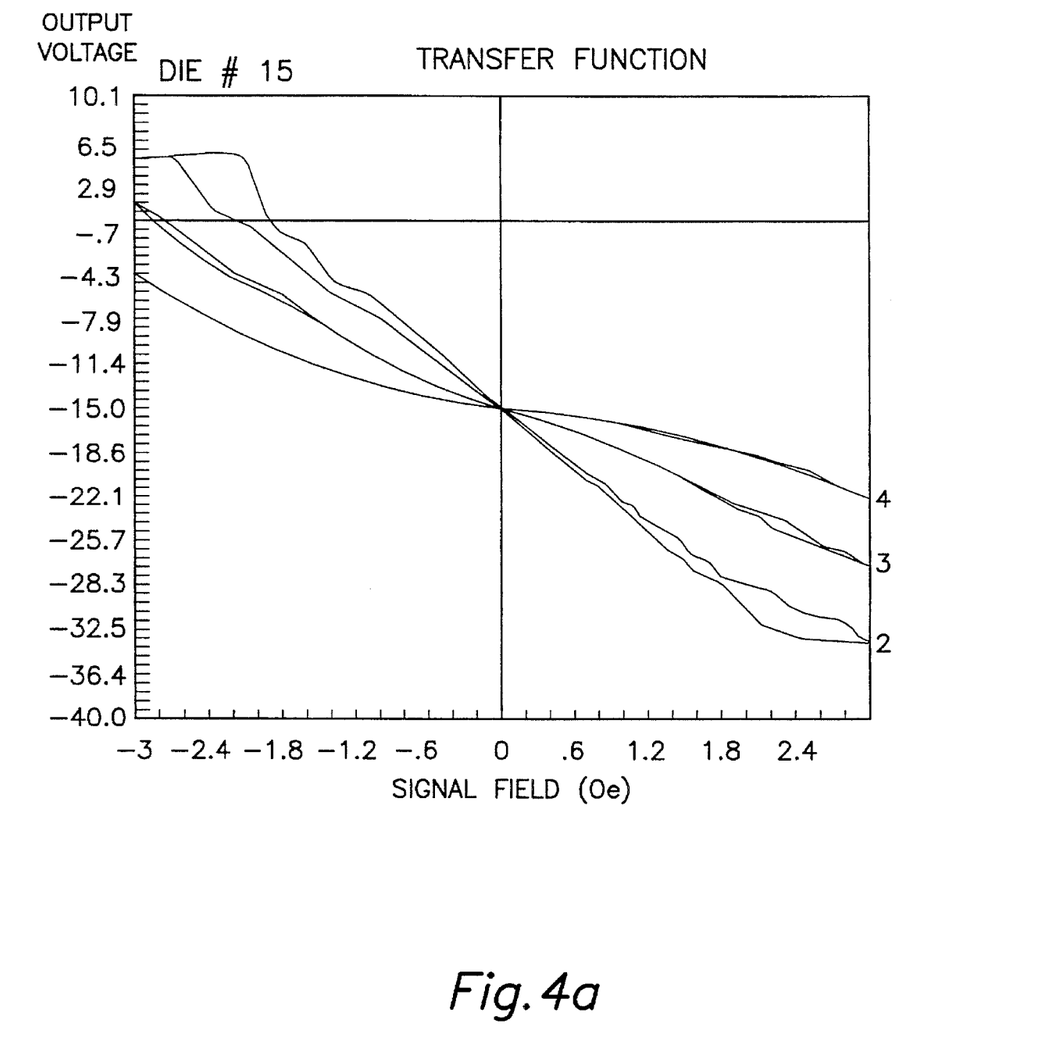
FIGS. 4a–4c illustrate the transfer function of the present invention.
Figure 4B:
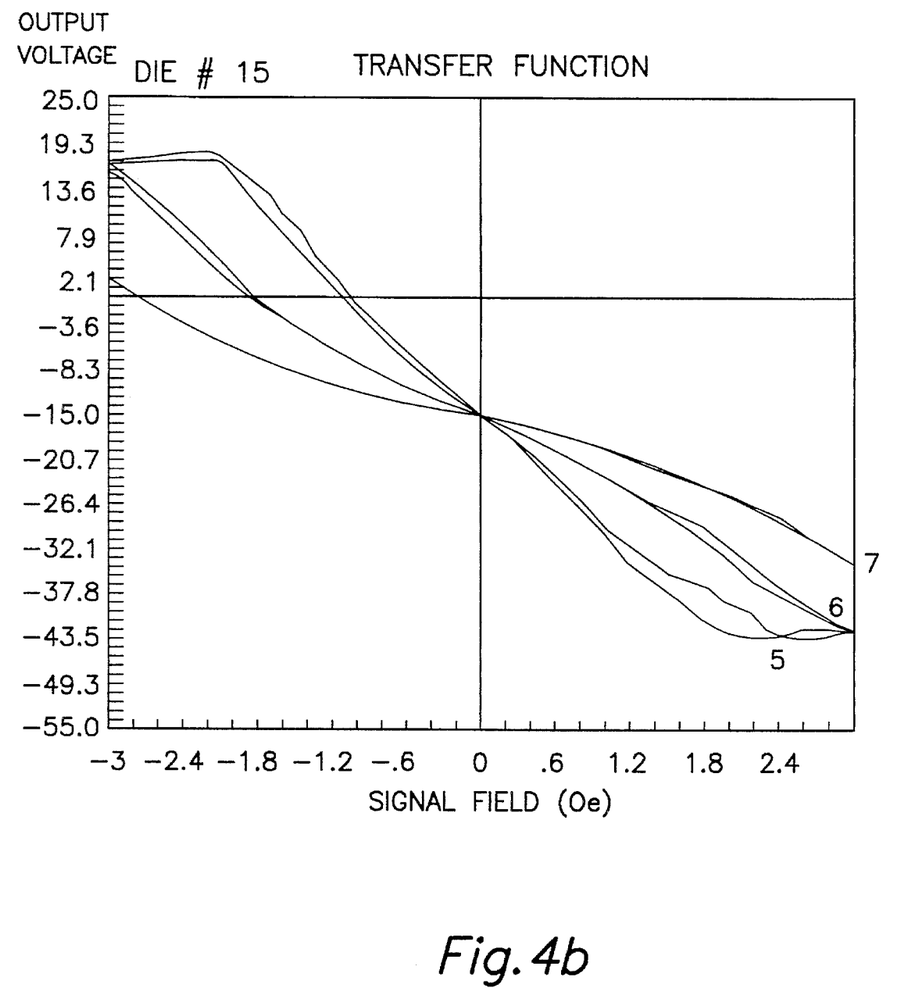
Figure 4C:
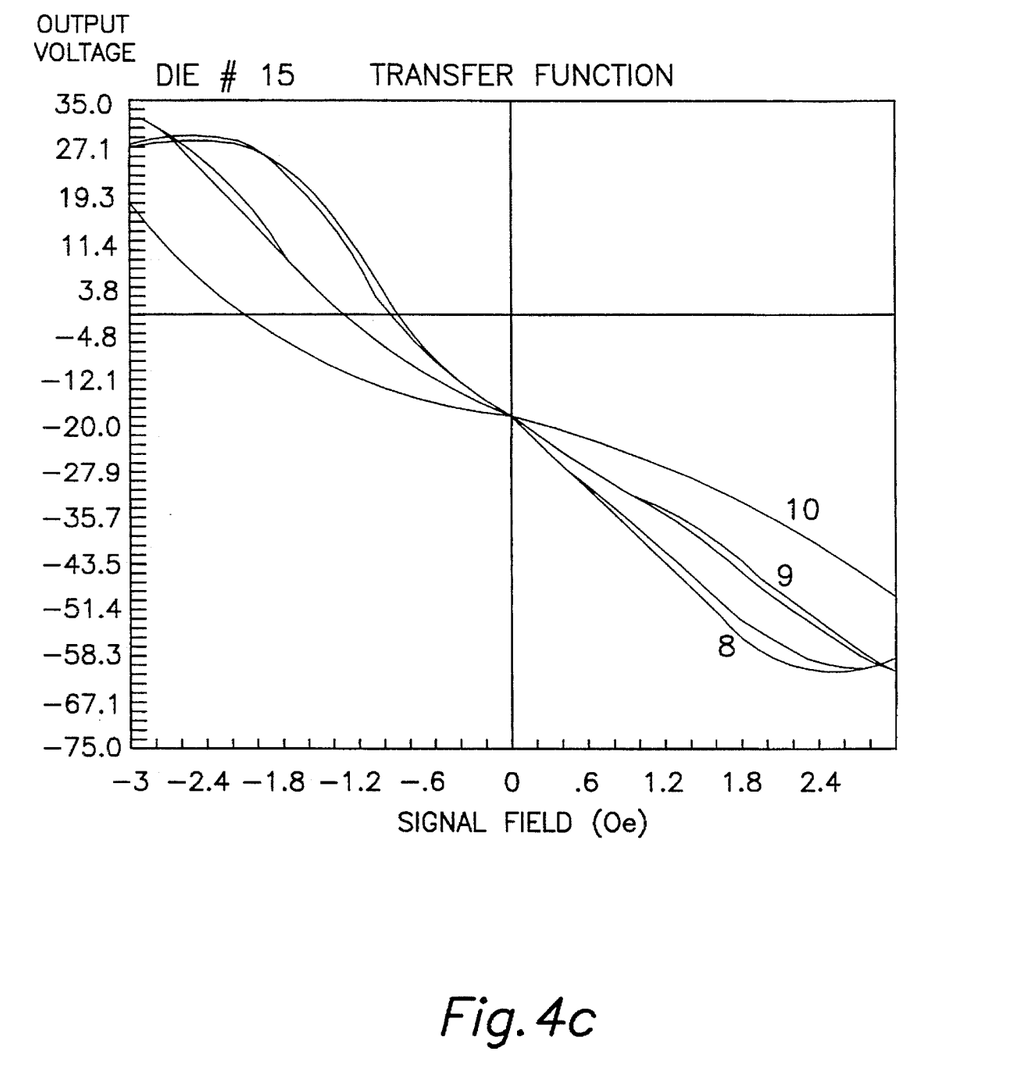

Measurements performed using the transducer configuration of FIG. 3a in a bridge as shown in FIG. 3b indicate that the transfer function and sensitivity of apparatus 10 may be varied by varying either or both of the bridge supply voltage and the current I3. In FIG. 3b, resistors 121 and 123 are nonmagnetoresistive. A voltage is applied across 128 and 132, and a bridge output is read across 125 and 127 by a suitable detector. The transfer function and sensitivity are shown in FIGS. 4a-4c, with the test number also shown. A set-reset current pulse of 1 amp was used in all test and the bridge current, bridge voltage, set-strap current and sensitivity are shown in Table 1.

TABLE 1

| Test Number | 2 | 5 | 8 |
| --- | --- | --- | --- |
| Bridge Current | 7 ma | 10 ma | 13 ma |
| Bridge Volt | 6.85 v | 9.85 v | 12.94 v |
| Set Strap Current | 50 ma | 50 ma | 50 ma |
| Sensitivity (mV/V/Oe) | .848 | 1.285 | 1.543 |
| Test Number | 3 | 6 | 9 |
| Bridge Current | 7 ma | 10 ma | 13 ma |

TABLE 1-continued

| Bridge Volt | 6.85 v | 9.87 v | 12.96 v |
| --- | --- | --- | --- |
| Set Strap Current | 75 ma | 75 ma | 75 ma |
| Sensitivity (mV/V/Oe) | .56 | .755 | .999 |
| Test Number | 4 | 7 | 10 |
| Bridge Current | 7 ma | 10 ma | 13 ma |
| Bridge Volt | 6.85 v | 9.88 v | 12.98 v |
| Set Strap Current | 100 ma | 100 ma | 100 ma |
| Sensitivity (mV/V/Oe) | .341 | .481 | .673 |

Figure 5:
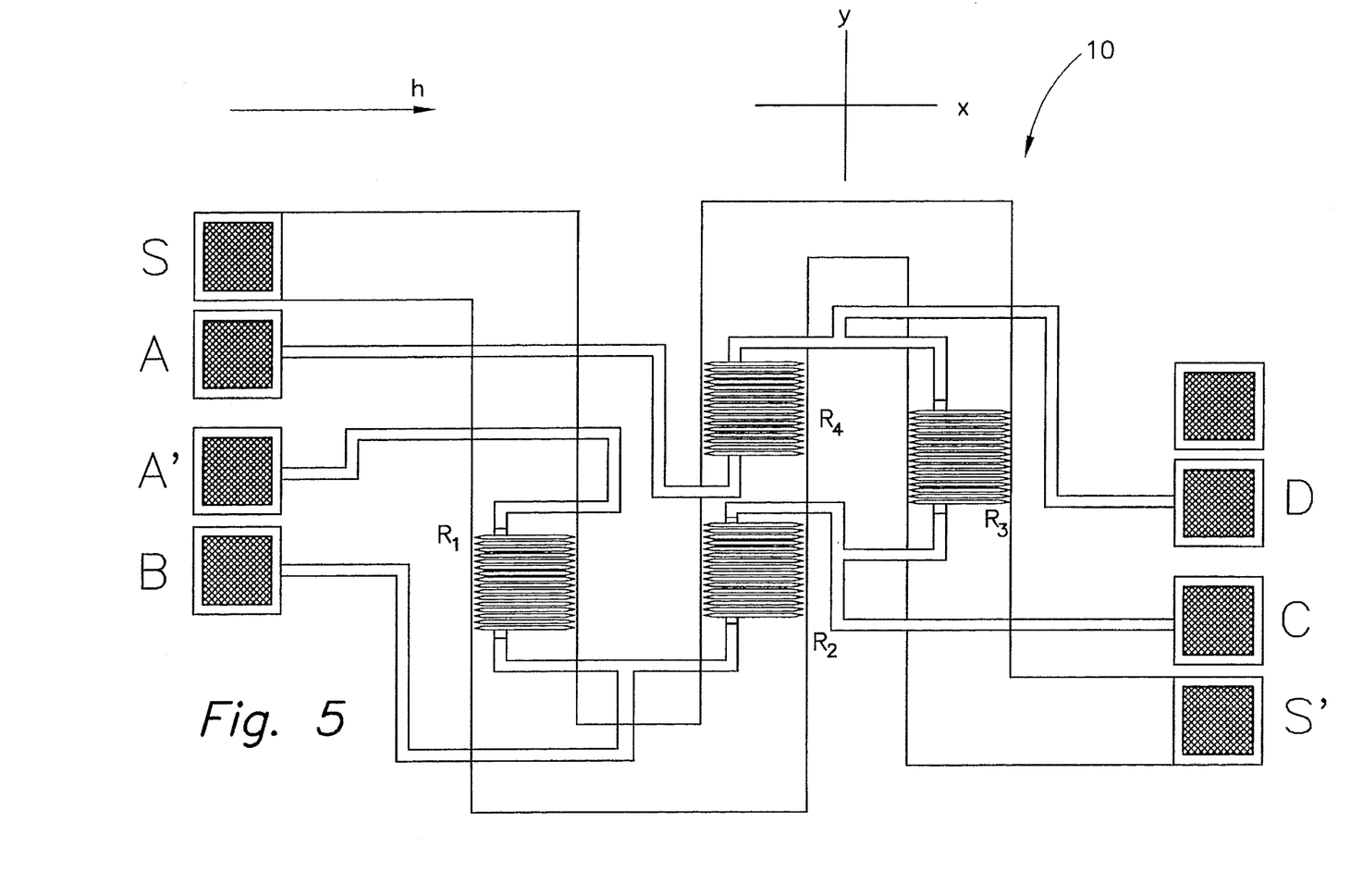
FIG. 5 shows an implementation of a coupled film transducer.

FIG. 5 shows an implementation of coupled film transducer concept to design a magnetoresistive transducer. Several long strips of coupled magnetoresistive films are connected in series to make four resistors which form four legs of a Wheatstone bridge. There are legs R1, R2, R3 and R4. They are shown such that pads A and A' can be connected to a supply voltage, pad C can be connected to the ground, and pads B and D can be connected to a differential amplifier to read the bridge voltage difference in response to a magnetic field.

In order to be sensitive to a magnetic field, the two legs $R_1$ and $R_3$ must be magnetized along either the positive or negative x axis, while the remaining legs $R_2$ and $R_3$ must be magnetized in the opposite direction along the x axis. This is accomplished by the S-shaped strap placed on top of the four legs, which causes nearly uniform but oppositely directed magnetic fields to be applied to the pairs $R_1$, $R_3$ and $R_2$, $R_4$. To set the coupled film transducer for sensing magnetic field, a short current pulse is applied to the pads S and S'. Once properly set, a supply voltage is applied to the bridge, the supply voltage is selected such that a current resulting in a desired sensitivity flows through the coupled films, bearing in mind that the sensitivity is a function of supply current. In this configuration the transducer is sensitive to fields along the x axis and is insensitive to fields along the y axis.

Embodiments have been shown of four leg wheatstone bridge arrangements. It is to be understood that a two leg bridge utilizing constant current sources could also be used, for example with the arrangement shown on chip 140 of FIG. 3a.

In addition, while the present invention has been discussed with reference to using two or more coupled film magnetoresistive elements in various bridge arrangements, the principle is applied to only a single coupled film magnetoresistive element and circuit means for monitoring the change in resistance due to a magnetic field. For example, a nonmagnetoresistive resistor in series with a coupled film magnetoresistive element with a voltage impressed across the series combination and voltage measuring means for measuring the voltage change across the magnetoresistive element.

I claim:

1. Apparatus for sensing magnetic field components, comprising:

first and second magnetically coupled film magnetic field sensing elements arranged to change resistance in response to said magnetic field components in a first direction when said elements are biased by a first current through said first and second elements;

a current carrying conductor located to set a direction of magnetization in a first direction in said first element and in a second direction in said second element when a second current is passed through said conductor;

third and fourth resistive elements, said first and second magnetic field sensing elements and said third and fourth resistive elements arranged in a four leg bridge having an output terminating region;

means for applying a voltage to said bridge, said voltage establishing said first current;

said apparatus having a transfer function relating said sensed magnetic field components to an output signal at said output terminating region; and means for providing a third current through said current carrying conductor for adjusting said transfer function by varying said third current.

2. Apparatus of claim 1 wherein said means for applying voltage is adjustable.

3. Apparatus of claim 1 wherein said first and said second elements each comprise a plurality of long narrow strips connected in series and said current carrying conductor has a first leg and a second leg and is U shaped with said strips of said first element perpendicular to said first leg and said strips of said second element perpendicular to said second leg, said strips separated from said legs by a dielectric layer.

4. Apparatus of claim 3 wherein said first and second elements, said current carrying conductor, and means for electrically connecting to said first and second elements and to said current carrying conductor are located on a single integrated circuit die.

5. Apparatus of claim 4 wherein said single integrated circuit die has and area of less than one millimeter square.

6. Apparatus for sensing magnetic field components, comprising:

first and second coupled film magnetic field sensing elements, each said sensing element comprising magnetically coupled films, each said element arranged to change resistance in response to said magnetic field components in a first direction when said elements are biased by a first current through said first element and a second current through said second element;

a current carrying conductor located to set a direction of magnetization in a first direction in said first element and in a second direction in said second element when a third current is passed through said conductor;

bridge means for connection with said first and second elements to form an electrical bridge arrangement having an output terminating region;

means for energizing said bridge arrangement to establish said first current and said second current;

said bridge arrangement haveing a transfer function relating said sensed magnetic field components to an output signal at said output terminating region; and means for providing a fourth current through said current carrying conductor for adjusting said transfer function by varying said fourth current.

7. Apparatus of claim 6 wherein said means for energizing said bridge arrangement is adjustable.

8. Apparatus of claim 6 wherein said first and said second elements each comprise a plurality of long narrow strips connected in series and said current carrying conductor has a first leg and a second leg and is U shaped with said strips of said first element perpendicular to said first leg and said strips of said second element perpendicular to said second leg, said strips separated from said legs by a dielectric layer.

9. Apparatus of claim 8 wherein said first and second elements, said current carrying conductor, and means for electrically connecting to said first and second elements and to said current carrying conductor are located on a single integrated circuit die.

10. Apparatus of claim 9 wherein said single integrated circuit die has and area of less than one millimeter square.

* * * * *